| (12) United States Patent | (10) Patent No.: | US 8,718,591 B2 |
|---|---|---|
| Allott et al. | (45) Date of Patent: | *May 6, 2014 |

(54) DISCRETE TIME POLYPHASE MIXER

(71) Applicant: RF Micro Devices, Inc., Greensboro, NC (US)

(72) Inventors: Stephen Allott, Scotts Valley, CA (US); Thomas Gregory McKay, Boulder Creek, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/907,091

(22) Filed: May 31, 2013

(65) Prior Publication Data

US 2013/0267188 A1    Oct. 10, 2013

Related U.S. Application Data

(63) Continuation of application No. 13/049,197, filed on Mar. 16, 2011, now Pat. No. 8,478,220.

(60) Provisional application No. 61/314,434, filed on Mar. 16, 2010.

(51) Int. Cl.
    *H04B 1/26* (2006.01)

(52) U.S. Cl.
    USPC .......................................................... 455/326

(58) Field of Classification Search
    USPC .............. 455/232.1, 296, 307, 313, 314, 323, 455/324, 326, 330, 333, 334
    See application file for complete search history.

(56) References Cited

U.S. PATENT DOCUMENTS

| 8,121,577 | B1 * | 2/2012 | McKay | 455/326 |
| 2007/0037544 | A1 * | 2/2007 | Heikkinen | 455/323 |
| 2010/0248669 | A1 | 9/2010 | Jerng | |

OTHER PUBLICATIONS

Andrews, Caroline et al., "A Passive-Mixer-First Receiver with Baseband-Controlled RF Impedance Matching, < 6dB NF, and > 27dBm Wideband IIP3," Digest of Technical Papers for the 2010 IEEE International Solid-State Circuits Conference, Feb. 2010, pp. 46-48.

Andrews, Caroline et al., "A Passive Mixer-First Receiver with Digitally Controlled and Widely Tunable RF Interface," IEEE Journal of Solid-State Circuits, vol. 45, No. 12, Dec. 2010, pp. 2696-2708.

Notice of Allowance for U.S. Appl. No. 13/049,197, mailed Nov. 21, 2012, 8 pages.

Notice of Allowance for U.S. Appl. No. 13/049,197, mailed Mar. 1, 2013, 7 pages.

* cited by examiner

*Primary Examiner* — Thanh Le

(74) *Attorney, Agent, or Firm* — Withrow & Terranove, P.L.L.C.

(57) ABSTRACT

Embodiments of a radio frequency (RF) circuit provide translational filtering in accordance with an input impedance response that is an impedance image of a reactive circuit impedance response from a poly phase reactive circuit. The RF circuit may include a first mixer circuit that provides a first frequency offset for the impedance image and a second mixer circuit that provides an additional frequency offset. Accordingly, the second mixer circuit may allow for adjustments to a total frequency offset of the impedance image. The second mixer circuit may also be configured so that the impedance image rejects a negative frequency impedance response of the reactive circuit impedance response.

11 Claims, 12 Drawing Sheets

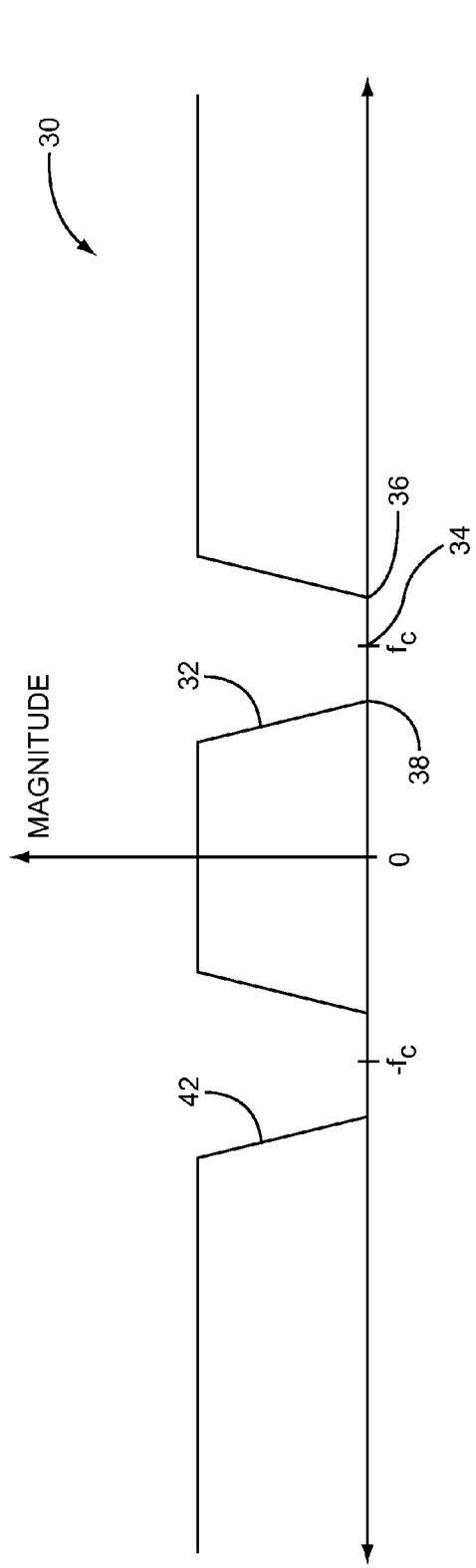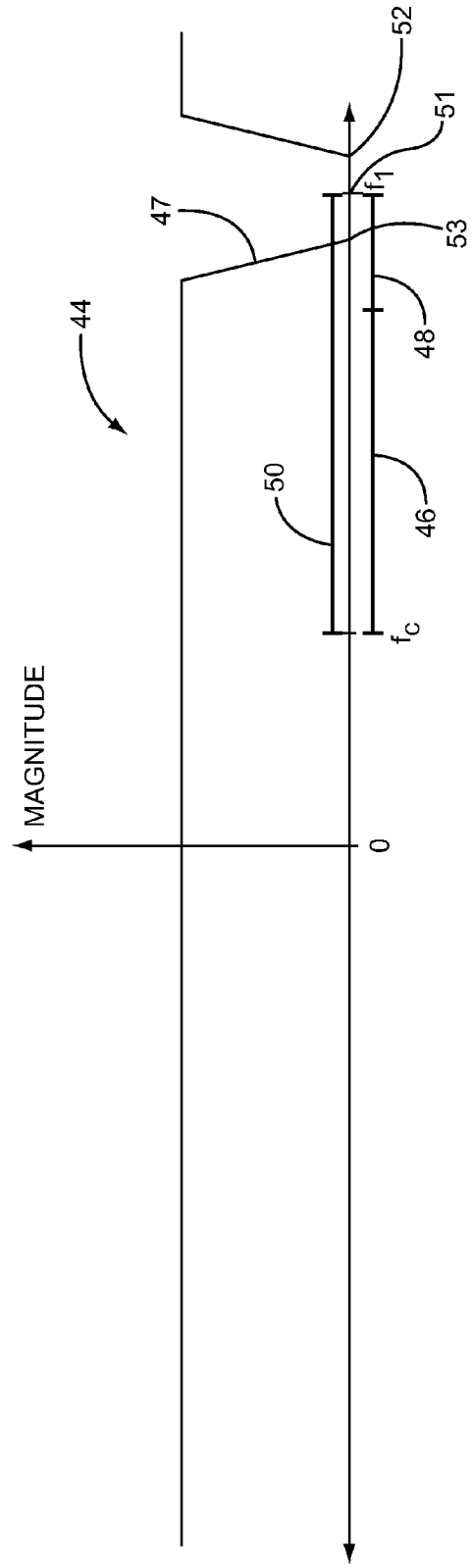

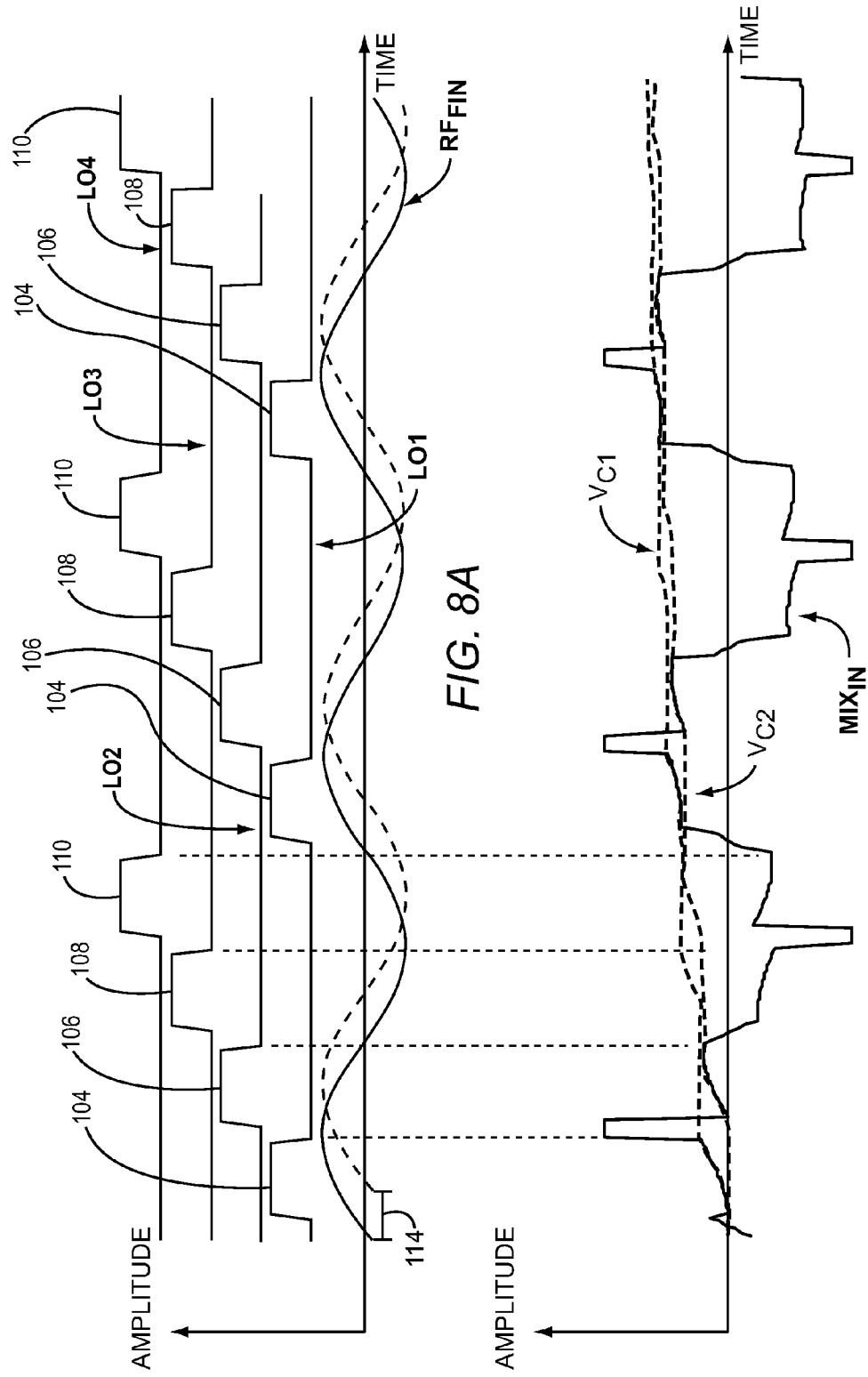

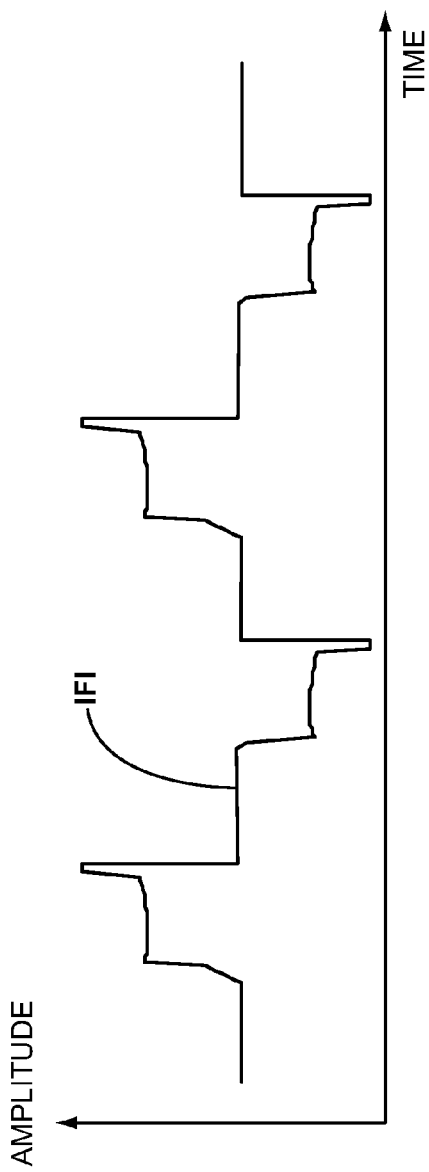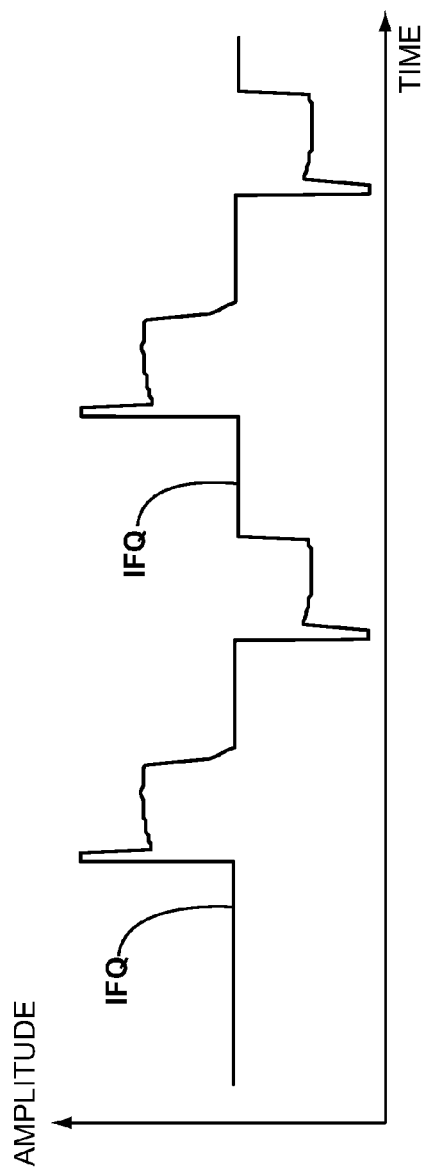

DISCRETE TIME POLYPHASE MIXER

RELATED APPLICATIONS

This application is a continuation of U.S. patent application Ser. No. 13/049,197, filed on Mar. 16, 2011 and entitled "DISCRETE TIME POLY PHASE MIXER," now U.S. Pat. No. 8,478,220, which claims the benefit of provisional patent application Ser. No. 61/314,434, filed on Mar. 16, 2010 and entitled "DISCRETE TIME POLY PHASE MIXER," the disclosures of which are hereby incorporated herein by reference in their entireties.

FIELD OF THE DISCLOSURE

The present disclosure relates to radio frequency (RF) circuits that provide RF filtering and methods of operating the same. In particular, the present disclosure relates to RF circuits that utilize translational filtering to receive a desired band and methods of operating the same.

BACKGROUND

Most integrated receivers used on modern mobile user devices have to achieve high levels of sensitivity. The integrated receiver needs to distinguish between a particular band for receiving information of interest and the multitude of bands either transmitted on the same communication channel or in neighboring communication channels. Typically, a combination of Surface Acoustic Wave (SAW) filters and high-Q chip inductors have been provided to meet the required band sensitivity. If the integrated receiver has to receive information from various bands, the disadvantage to these solutions is that multiple receiver circuits are required for the multiple bands and/or communication channels.

Translational filters may also be utilized to provide the required sensitivity to the multiplicity of bands. These translational filters may provide a high-Q filter response by utilizing a mixer circuit to convert a low frequency impedance response into a desired frequency band. Translation filter operate by down converting an input signal associated with the RF signal in accordance with a first oscillation signal to intermediate frequencies (IF) or baseband frequencies and then filtering the down converted signal with a reactive circuit having an impedance response centered around the IF or baseband frequencies. The input impedance response presented to the input signal is an impedance image of the impedance response of the reactive circuit, which ideally is offset from the reactive circuit impedance response by the first oscillation frequency.

This arrangement is advantageous because often it is easier to filter at IF and baseband than at RF frequencies and thus the translation filter provides the advantages of low frequency filtering at RF frequencies. The reactive circuit of the translation filter may have reactive components with variable reactive impedance values thereby allowing the poly phase reactive circuit to vary the characteristics of the reactive circuit impedance response in accordance with the band or bands of interest. Also varying the first oscillation frequency allows the translational filter to center the characteristics of the input impedance response at different frequencies for different bands.

If the parasitic reactive impedances of the source are insignificant the arrangement works well and the first mixer circuit presents an input impedance response having a notch or a pass band(s) having a high-Q factor centered around the desired band. Unfortunately, this is not always the case, and the source may have reactive impedances that cause a discrepancy between the actual offset of the impedance image and the first oscillation frequency such that the desired band is blocked instead of received.

Another problem with the arrangement is that the impedance image may include negative frequency impedance response from the impedance response of the reactive circuit. Consequently, for example, if reactive circuit impedance response is a low pass impedance response that is translated by the mixer circuit into a bandpass impedance response centered at approximately the local oscillation frequency, the bandpass of the bandpass impedance response may have twice the bandwidth thus lowering the Q-factor. Alternatively, if the reactive circuit impedance response is a bandpass impedance response, then the impedance image will include two bandpasses after being offset by the mixer, one from the positive frequency impedance response and another from the negative frequency impedance response of the reactive circuit impedance response. As a result, unwanted signals may be received due to the acceptance of the impedance image of the negative frequency impedance response.

What is needed is an RF circuit that permits the input impedance response to be further adjusted to compensate for the effects of the parasitic impedances of the source and/or also rejects the negative frequency impedance responses from the reactive circuit.

SUMMARY

Those skilled in the art will appreciate the scope of the present disclosure and realize additional aspects thereof after reading the following detailed description of the preferred embodiments in association with the accompanying drawing figures.

The present disclosure relates to a radio frequency (RF) circuit that provides translational filtering and allows an input impedance response to be adjusted to compensate for the reactive impedances of a source and/or rejects a negative frequency impedance response from a reactive circuit. The RF circuit may include a poly phase reactive circuit that provides a reactive circuit impedance response. To translate the reactive circuit impedance response in accordance with a desired frequency band, the RF circuit may include a first mixer circuit and a second mixer circuit. The first mixer circuit may be connected to receive an input signal that is associated with the RF signal from the source.

The first mixer circuit may provide the input impedance response and present an input impedance in accordance with the input impedance response to the source. In one embodiment, the first mixer circuit may receive one or more oscillation signals all operating at approximately a first oscillation frequency. The first mixer circuit is operable to mix the one or more local oscillation signals with the input signal and generate a first in-phase signal and a first quadrature phase signal.

A second mixer circuit may be coupled between the first mixer circuit and the poly phase reactive circuit. In one embodiment, the second mixer circuit also receives four oscillation signals, all operating at approximately a second oscillation frequency. The first two oscillation signals are substantially orthogonal to one another. The other two oscillation signals are approximately in antiphase with a different one of the first two oscillation signals, and are thus substantially orthogonal to one another. The second mixer circuit is operable to mix the first in-phase signal and the first quadrature phase signal with the four oscillation signals to generate a second in-phase signal. To generate a second quadrature phase signal, an inverse of the first quadrature phase signal and the first in-phase signal are mixed with the four oscillation signals.

The first mixer circuit and the second mixer circuit cause the input impedance response of the first mixer circuit to be an impedance image of the reactive circuit impedance response. The first mixer circuit is operable to cause a first frequency offset between the impedance image and the reactive circuit impedance response based on the first oscillation frequency. However, the first frequency offset may require further adjustments due to the reactive impedances of the source. The second mixer circuit allows for an additional frequency offset based on the second oscillation frequency that may be varied to compensate for the reactive impedances in the source. For example, if the first oscillation frequency was 1 GHz but, due to the reactive impedances in the source the impedance image was only offset by 990 MHz, the second oscillation frequency can be provided around 100 kHz to further offset the impedance image to around 1 GHz. Also, by mixing both the first in-phase signal and the first quadrature phase signal to generate the second in-phase signal and the inverse of the first quadrature phase signal and the first in-phase signal to generate second quadrature phase signal, the impedance image rejects the negative frequency impedance response of the reactive circuit impedance response.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 3A illustrates another embodiment of a reactive circuit impedance response that may be provided by the poly phase reactive circuit in the RF circuit of FIG. 1.

FIG. 3B illustrates another embodiment of an input impedance response that is an impedance image of the reactive circuit impedance response shown in FIG. 3A for the first mixer circuit in the RF circuit illustrated in FIG. 1.

FIG. 8A is a graph an embodiment of four oscillation signals and an embodiment of an RF input signal.

FIG. 8B is a graph of one embodiment of a mixer input signal.

FIG. 8C is a graph of one embodiment of a first in-phase signal.

FIG. 8D is a graph of one embodiment of a first quadrature phase signal.

DETAILED DESCRIPTION

Figure 1:
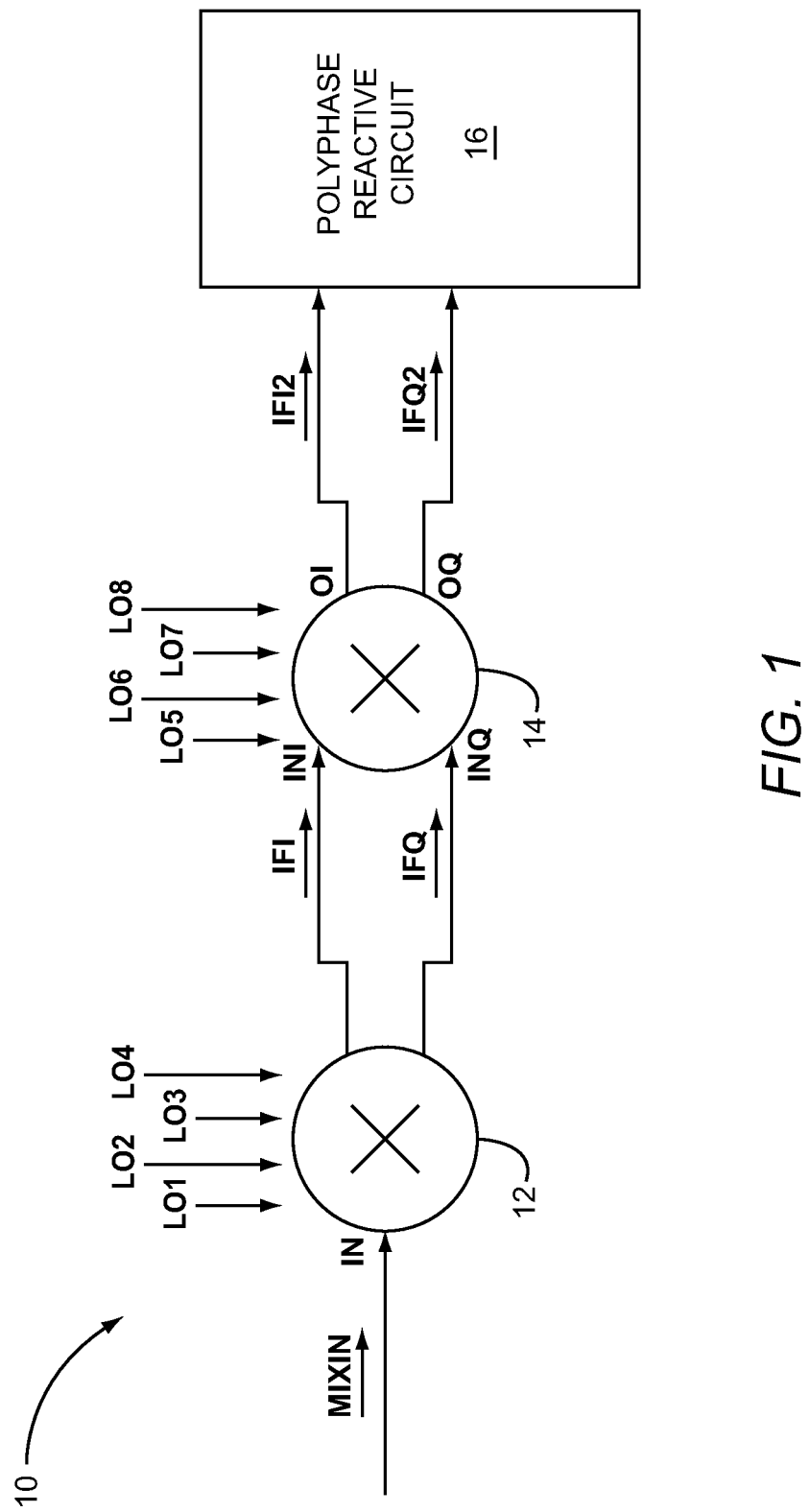
FIG. 1 illustrates an embodiment of a radio frequency (RF) circuit in accordance with this disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a controllable input impedance radio frequency (RF) circuit, which provides a high quality factor (Q-factor) impedance response. The high-Q impedance response may be used as a high-Q RF bandpass filter or a high-Q notch filter in a receiver of a mobile user device, such as a cellular phone, laptop, and any other device having portable wireless communication devices. The high-Q impedance response may be provided as an impedance image of a reactive circuit impedance response of a poly phase reactive circuitry. The reactive circuit impedance response may be centered at intermediate frequencies (IF) or baseband frequencies. The poly phase reactive circuitry may include a variety of reactive components including poly phase reactive components, such as capacitive elements.

The RF circuit has a first mixer circuit and a second mixer circuit. The first mixer circuit may down convert an input signal operating at RF frequencies to intermediate frequencies (IF) or baseband frequencies. To do this the first mixer circuit mixes the input signal with one or more oscillation signals operating at approximately a first oscillation frequency and generates a first in-phase signal and a first quadrature phase signal. The first mixer circuit thus offsets the impedance image from the reactive circuit impedance response based on the first oscillation frequency. The second mixer circuit may then mix the first in-phase signal and the first quadrature phase signal generated by the first mixer circuit with one or more oscillation signals operating at approximately a second oscillation frequency and generate a second in-phase signal and a second quadrature phase signal. The second mixer circuit further offsets the impedance image and allows for a total frequency offset between the impedance image and the reactive circuit impedance response to be adjusted. The second in-phase signal and the second quadrature phase signal may be provided to the poly phase reactive circuit so that a negative frequency impedance response of the reactive circuit impedance response is rejected by the impedance image.

In some embodiments of the present invention, the poly phase reactive circuitry includes at least one capacitive element that operates as an in-phase reactive component and at least one capacitive element that operates as a quadrature phase reactive component. The second mixer circuit may be coupled to the poly phase reactive circuit and provide the second in-phase signal to the in-phase reactive component and the second quadrature phase signal to the quadrature phase reactive component. This translates the reactive circuit impedance response into the RF frequencies as the input impedance response of the first mixer circuit, which is an impedance image of the reactive circuit impedance response.

FIG. 1 shows one embodiment of an RF circuit 10 in accordance with this disclosure. The RF circuit 10 has a first mixer circuit 12, a second mixer circuit 14, and a poly phase reactive circuit 16. The first mixer circuit 12 receives a mixer input signal MIXIN into a mixer input IN. The first mixer circuit 12 mixes the mixer input signal MIXIN with a first, second, third, and fourth local oscillation signals LO1, LO2, LO3, LO4 to produce an input impedance response at an input IN of the first mixer circuit 12. The mixer input signal MIXIN may operate at an RF frequency. The local oscillation signals LO1, LO2, LO3, LO4, may each be provided at approximately a first oscillation frequency that down converts the mixer input signal MIXIN to an intermediate frequency (IF) or baseband. The mix of the first, second, third, and fourth local oscillation signals LO1, LO2, LO3, LO4 with the mixer input signal MIXIN by the first mixer circuit 12, generates a first in-phase signal, IFI and a first quadrature phase signal, IFQ, from the mixer input signal MIXIN. The first in-phase signal IFI and the first quadrature phase signal IFQ are substantially orthogonal one another. Ideally, the mixer input signal MIXIN is down converted by precisely the first oscillation frequency. If for example, the reactive circuit impedance response has an impedance peak, the impedance peak may be provided when the frequency and phase of the mixer input signal MIXIN match the frequency and phase of the local oscillation signals LO1, LO2, LO3, LO4. However, due to parasitic reactive impedances from a source, the phase of the mixer input signal MIXIN, may not match the phase of the local oscillation signals LO1, LO2, LO3, LO4, when the frequency of the mixer input signal MIXIN is at the first oscillation frequency. This causes a discrepancy between the frequency offset provided by the first mixer circuit 12 for the impedance peak and the first oscillation frequency.

The RF circuit 10 may compensate for this discrepancy by providing the second mixer circuit 14. The second mixer circuit 14 is operably associated with the first mixer circuit 12 to receive the first in-phase signal IFI, at input INI and the first quadrature phase signal, IFQ, at input INQ. The second mixer circuit 14 is also configured to receive a fifth, sixth, seventh, and eight local oscillation signal, LO5, LO6, LO7, LO8 each operating at approximately a second oscillation frequency.

The second mixer circuit 14 is operably associated with the poly phase reactive circuit 16. The second mixer circuit 14 also has an input impedance response and provides an input impedance between the input INI and the input INQ in accordance with an input impedance response. The second mixer circuit 14 is operable to mix the first in-phase signal IFI, with the fifth local oscillation signal LO5, to mix the first quadrature phase signal IFQ, with the sixth local oscillation signal LO6, to mix the first in-phase signal IFI, with the seventh local oscillation signal LO7, and to mix the first quadrature phase signal IFQ, with the eight local oscillation signal LO8, which generates a second in-phase signal, IFI2. The second mixer circuit 14 is also operable to mix an inverse of the first quadrature phase signal IFQ, with the fifth local oscillation signal LO5, to mix the first in-phase signal IFI, with the sixth local oscillation signal LO6, to mix the inverse of the first quadrature phase signal IFQ, with the seventh local oscillation signal LO7, and to mix the first in-phase signal IFI with the eight local oscillation signal LO8, which generates a second quadrature phase signal, IFQ2. The second in-phase signal IFQ2, and the second quadrature phase signal IFQ2 are provided at outputs OI, OQ respectively.

Figure 2A:
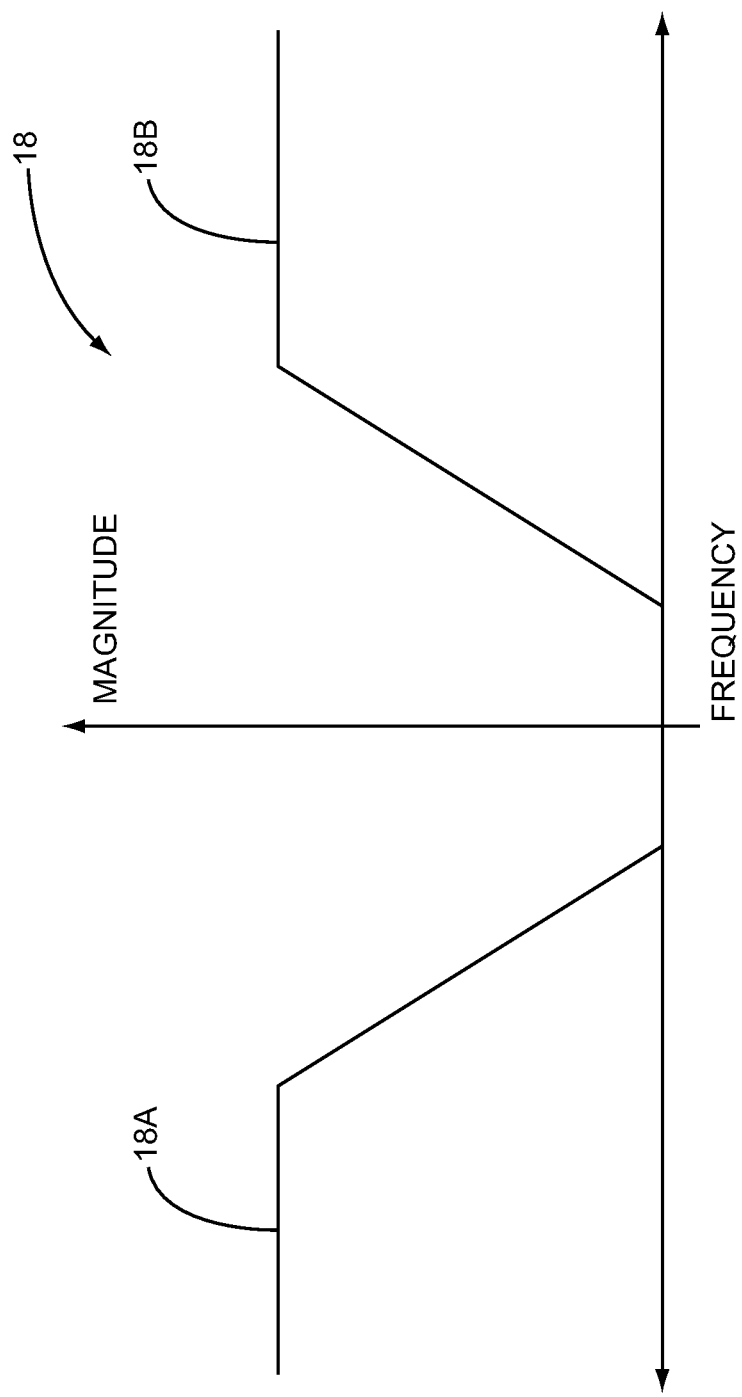
FIG. 2A illustrates one embodiment of a reactive circuit impedance response that may be provided by a poly phase reactive circuit in the RF circuit of FIG. 1.
Figure 2B:
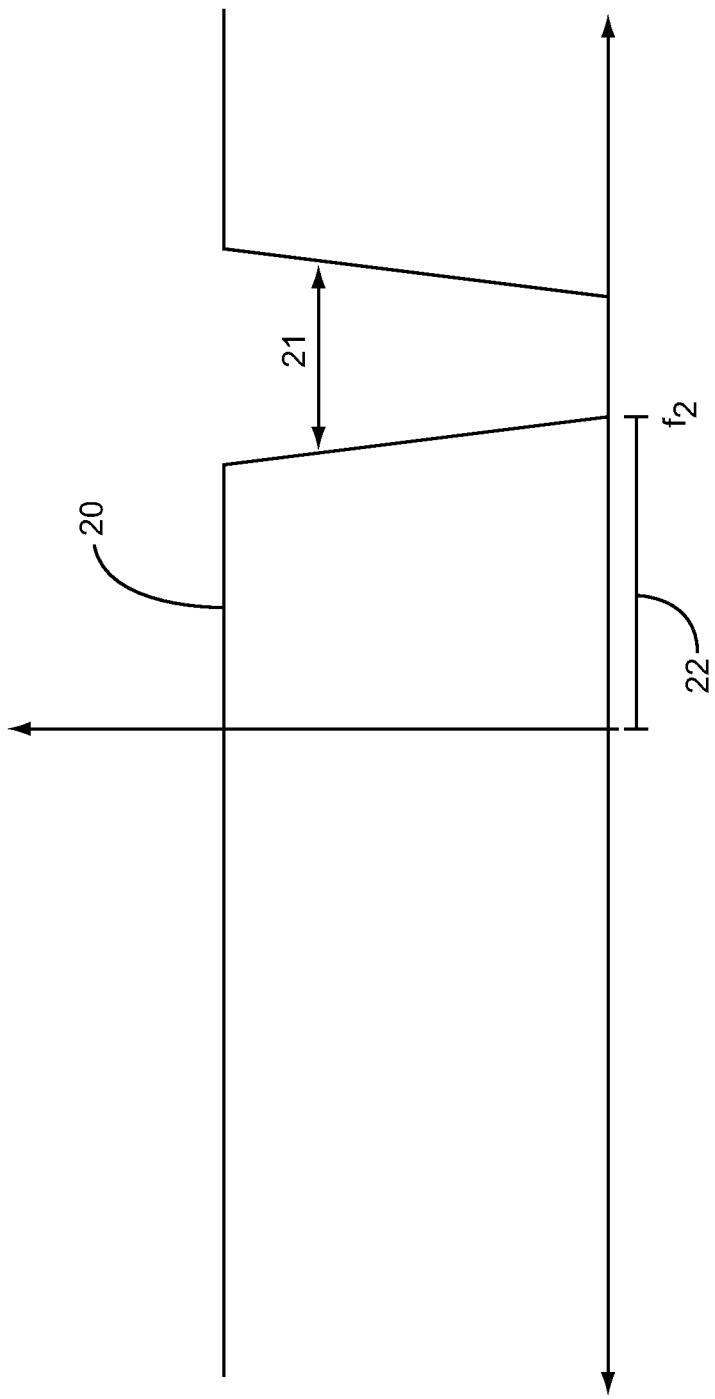
FIG. 2B illustrates one embodiment of an input impedance response that is an impedance image of the reactive circuit impedance response shown in FIG. 2A for a second mixer circuit in the RF circuit illustrated in FIG. 1.

Referring now to FIG. 1 and FIG. 2A-2C, the poly phase reactive circuit 16 is coupled to outputs OI and OQ to receive the second in-phase signal IFI2, and the second quadrature phase signal IFQ2. FIG. 2A illustrates a type of a reactive circuit impedance response 18 that may be provided by the poly phase reactive circuit 16. In this case, the reactive circuit impedance response 18 is a low pass impedance response having a negative frequency impedance response 18A and a positive frequency impedance response 18B. FIG. 2B illustrates an input impedance response 20 between the inputs INI and INQ of the second mixer circuit 14. The input impedance response 20 of the second mixer circuit 14 is an impedance image of the reactive circuit impedance response 18. The input impedance response 20 is the impedance image of the reactive circuit impedance response 18 because the reactive circuit impedance response 18 may be conceptualized as being "imaged" by the second mixer circuit 14 between the inputs INI and INQ to provide an input impedance response of the second mixer circuit 18. While the input impedance response 20 may or may not have the same impedance values as the reactive circuit impedance response 18, the input impedance response 20 does have substantially the same form as the reactive circuit impedance response 18. However, the input impedance response 20 has a frequency offset 22 from the reactive circuit impedance response 18 of the poly phase reactive circuit 16 and thus provides a bandpass 21. The frequency offset 22 is based on the second oscillation frequency and ideally is provided to be equal to the second oscillation frequency. Also, the second mixer circuit 14 causes the impedance image shown in FIG. 2B to reject the negative frequency impedance response 18A of the reactive circuit impedance response 18. In this manner, the bandpass 21 is reduced to approximately half of the value it would have had if the impedance image included the negative frequency impedance response 18A.

Figure 2C:
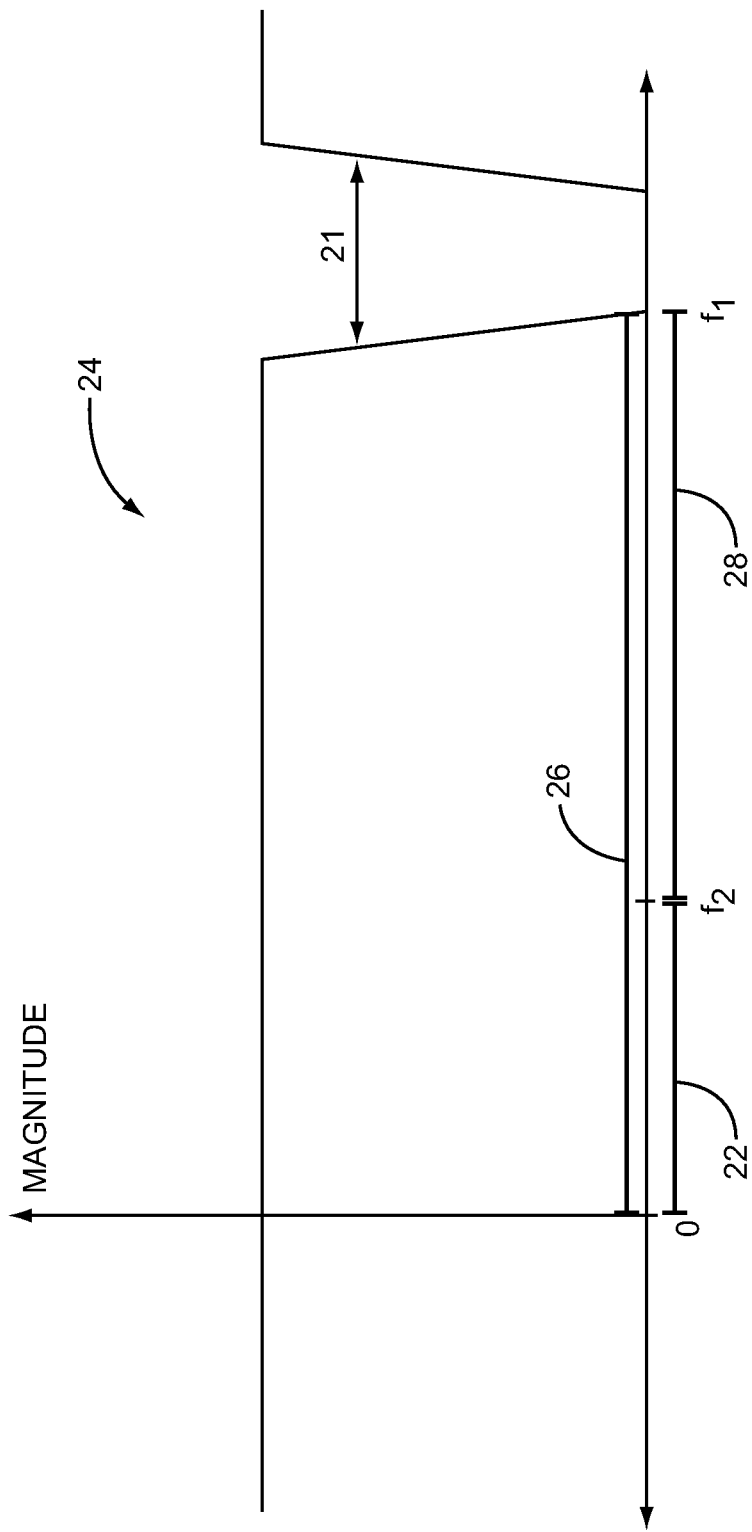
FIG. 2C illustrates one embodiment of an input impedance response that is an impedance image of the reactive circuit impedance response shown in FIG. 2A for a first mixer circuit in the RF circuit illustrated in FIG. 1.

The input impedance response 24 of the first mixer circuit 12 at IN is shown in FIG. 2C. The input impedance response 24 is an impedance image of the input impedance response 20 of the second mixer circuit 14. Accordingly, the input impedance response 24 also rejects the negative frequency impedance response 18A and is also an impedance image of the reactive circuit impedance response 18. The input impedance response 24 of the first mixer circuit 12 has a total frequency offset 26 from the reactive circuit impedance response 18 based on both the first oscillation frequency and the second oscillation frequency. The first mixer circuit 12 is operable to provide a frequency offset 28 between the input impedance response 24 and the reactive circuit impedance response 18. The first oscillation frequency may be variable so that the frequency offset 28 can be provided around a band of interest. This frequency offset 28 is based on the first oscillation frequency but, as discussed above, may not be precisely equal to the first oscillation frequency due to the reactive impedances of a source.

Next, the second mixer circuit 14 is operable to provide additional frequency offset 22 between the input impedance response 24 and the reactive circuit impedance response 18. If the second oscillation frequency is variable, the frequency offset 22 may also be variable. In this manner, if the frequency offset 28 is not substantially equal to the first oscillation frequency, then the second oscillation frequency may be varied so that the total frequency offset 26 is closer to the first oscillation frequency. Furthermore, the frequency offset 22 may also be utilized to provide a shift so that a desired band is admitted closer to the center of the bandpass 21 rather than the edges of the bandpass 21. Accordingly, the RF circuit 10 allows the reactive circuit impedance response 18 to be translated to an RF frequency range by the total frequency offset 26 to provide RF filtering.

In FIG. 2C, the frequency offset 22 is drawn as providing the offset from the 0 frequency to frequency, $f_2$, and the frequency offset 28 is shown as providing the offset from frequency $f_2$ to frequency $f_1$. Note that it is just as valid to show the frequency offset 28 as providing the offset from the 0 frequency and then the frequency offset 22 as providing the offset to $f_1$. Also, the frequency offset 22 and the frequency offset 28 are not necessarily drawn to scale. For example, the first frequency offset is provided so that the input impedance response 24 is an impedance image with the RF frequency range. In contrast, the reactive circuit impedance response 18 may be centered at a baseband frequency or IF to RF frequencies. Thus, the frequency offset 28 may be provided so that the impedance image is offset from IF or baseband to RF frequencies. The other frequency offset 22 may be provided to more precisely offset the impedance image to the band of interest. Consequently, the frequency offset 28 may be several orders of magnitude larger than the frequency offset 22. For example, the first oscillation frequency may be around 100 MHz-5 GHz thereby providing the frequency offset 28 around these orders of magnitude. In contrast, the second oscillation frequency may vary from 0-100 KHz thereby providing the frequency offset 22 around these orders of magnitude.

Referring now to FIG. 1 and FIGS. 3A-3B, FIGS. 3A-3B illustrate additional impedance responses that may be provided by the RF circuit 10. In this case, the poly phase reactive circuit 16 provides another type of reactive circuit impedance response 30 having a positive frequency bandpass 32 centered at a center frequency 34 and having a high break frequency 36 and a low break frequency 38, as shown in FIG. 3A. Note that the reactive circuit impedance response 30 also has a negative frequency bandpass 42. FIG. 3B illustrates an input impedance response 44 of the first mixer circuit 12 at input IN. The input impedance response 44 is an impedance image of the reactive circuit impedance response 30. The first mixer circuit 12 is operable to provide a frequency offset 46 between the input impedance response 44 and the reactive circuit impedance response 30 based on the first oscillation frequency. The second mixer circuit 14 is operable to provide another frequency offset 48 that is additional to the frequency offset 46 and based on the second oscillation frequency. Thus, the first mixer circuit 12 and the second mixer circuit 14 are operable to provide a total frequency offset 50 between the input impedance response 44 and the reactive circuit impedance response 30. The input impedance response 44 includes a bandpass 47 that is an impedance image of the positive frequency bandpass 32. A center frequency 51, a high break frequency 52, and a low break frequency 53 of the bandpass 47 are each offset by the total frequency offset 50 from the center frequency 34, the high break frequency 36, and the low break frequency 38 of the positive frequency bandpass 32. However, the second mixer circuit 14 causes the input impedance response 44 to reject the negative frequency bandpass 42 of the reactive circuit impedance response 30 and thus the input impedance response 44 does not include an impedance image of the negative frequency bandpass 42 of the reactive circuit impedance response 30.

Figure 4A:
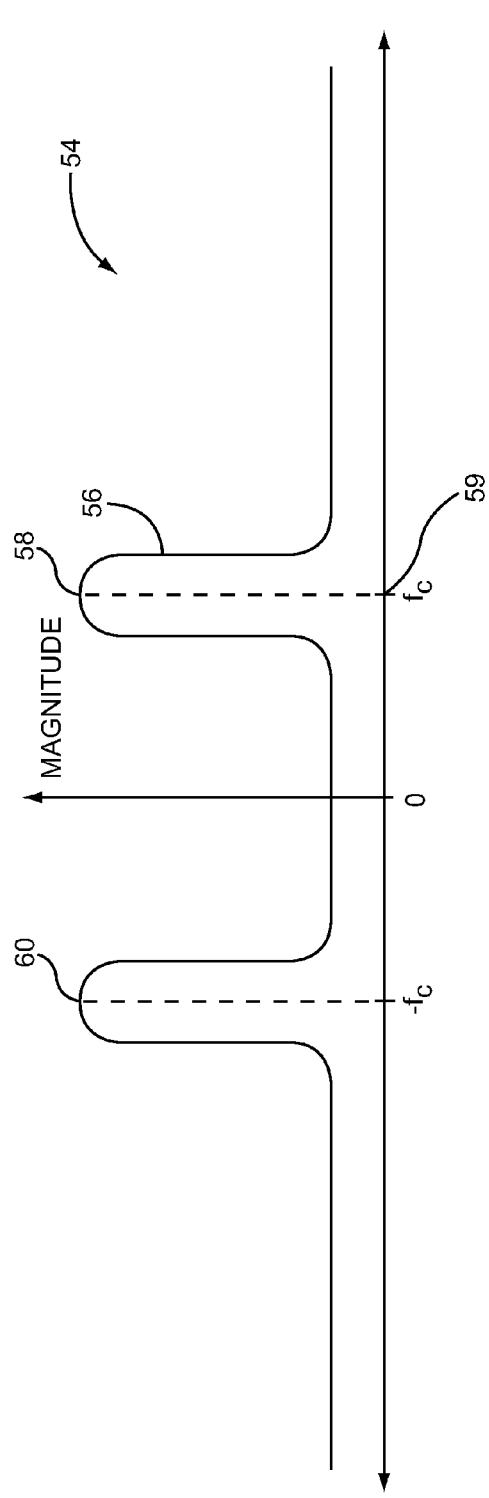
FIG. 4A illustrates yet another embodiment of a reactive circuit impedance response that may be provided by the poly phase reactive circuit in the RF circuit of FIG. 1.
Figure 4B:
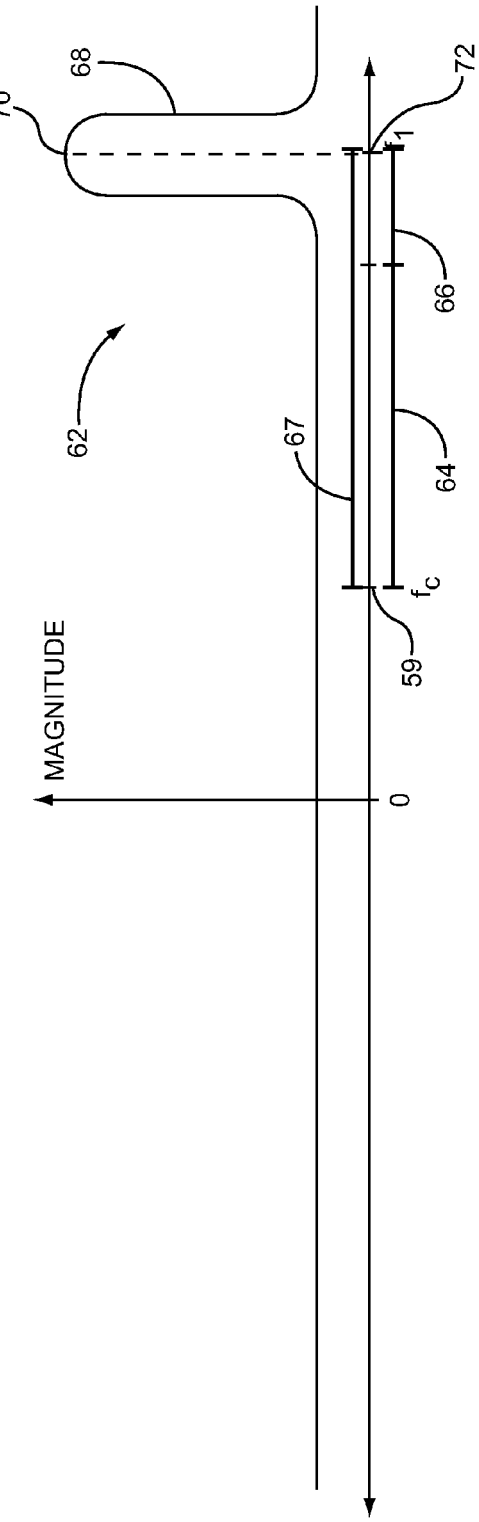
FIG. 4B illustrates yet another embodiment of an input impedance response that is an impedance image of the reactive circuit impedance response shown in FIG. 4A for the first mixer circuit in the RF circuit illustrated in FIG. 1.

Referring now to FIG. 1 and FIGS. 4A-4B, FIGS. 4A-4B illustrate additional impedance responses that may be provided by the RF circuit 10. In this case, the poly phase reactive circuit 16 provides another type of reactive circuit impedance response 54 having a positive frequency notch 56 with a positive frequency impedance peak 58 at a positive peak frequency 59. The reactive circuit impedance response 54 also has a negative frequency impedance peak 60. FIG. 4B illustrates an input impedance response 62 of the first mixer circuit 12 at input IN. The input impedance response 62 is an impedance image of the reactive circuit impedance response 54. The first mixer circuit 12 is operable to provide a frequency offset 64 between the input impedance response 62 and the reactive circuit impedance response 54 based on the first oscillation frequency. The second mixer circuit 14 is operable to provide another frequency offset 66 that is additional to the frequency offset 64 and based on the second oscillation frequency. Thus, the first mixer circuit 12 and the second mixer circuit 14 are operable to provide a total frequency offset 67 between the input impedance response 62 and the reactive circuit impedance response 54. In this manner, the input impedance response 62 has a frequency notch 68 that has a frequency impedance peak 70 at a peak frequency 72 offset from the positive peak frequency 59 by the total frequency offset 67. Also, the second mixer circuit 14 causes the input impedance response 62 to reject the negative frequency impedance peak 60 of the reactive circuit impedance response 54.

Note that the reactive circuit impedance responses 18, 30, 54 and input impedance responses 20, 24, 44, 62 illustrated in FIGS. 2A-2C, 3A-3B, and 4A-4B are simply examples of the types of impedances responses that may be provided by the RF circuit 10. The poly phase reactive circuit 16 may be configured to provide any type of reactive circuit impedance response. For example, the reactive circuit impedance response of the poly phase reactive circuit 16 may be configured to have both a notch and a bandpass thereby providing an input impedance response at the input IN also having a notch and a bandpass. In the alternative, the reactive circuit impedance response may have a plurality of notches and/or bandpasses and thus the input impedance response may have a plurality of notches and/or bandpasses. Also, the reactive circuit impedance response may be a low pass response with an additional bandpass and/or notch thereby providing an input impedance response with multiple bandpasses, a bandpass and a notch, or multiple bandpasses and a notch. In yet another alternative, the reactive circuit impedance response may be a high pass response thus providing an input impedance response with a notch. These and other reactive circuit impedance responses and input impedance responses would be apparent to one of ordinary skill in the art in light of this disclosure.

Figure 5:
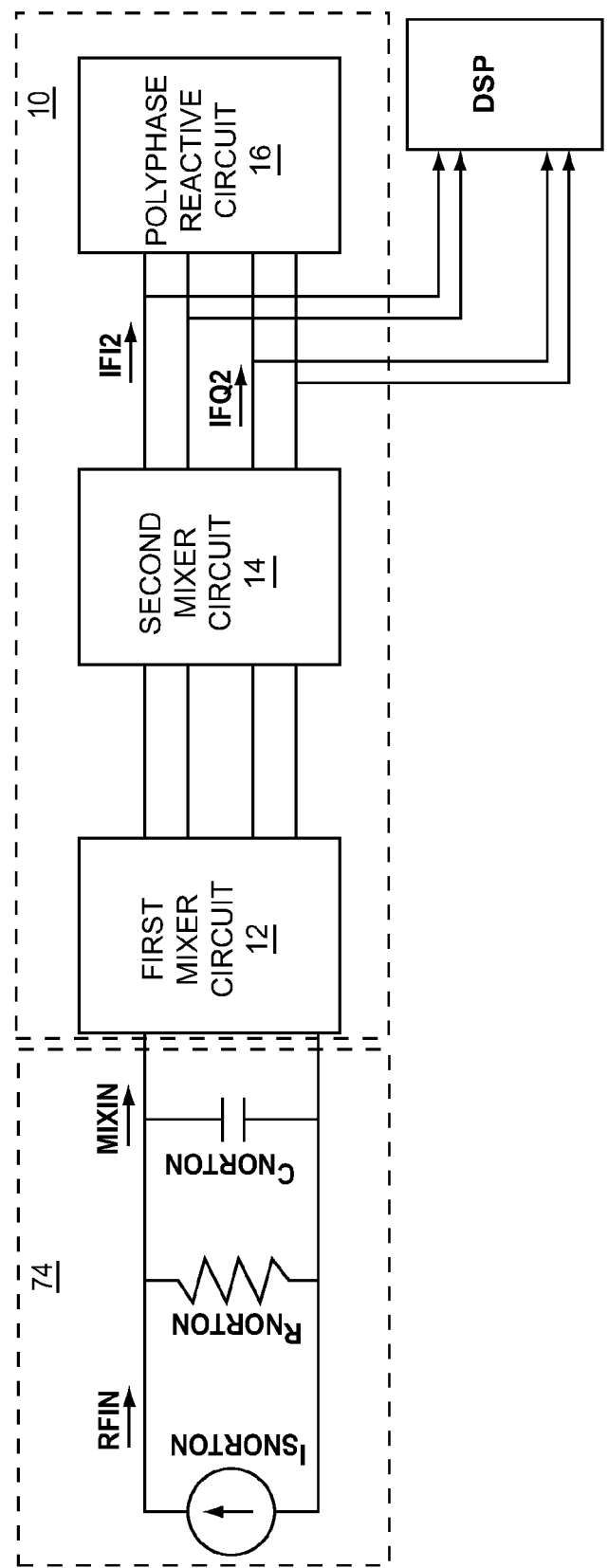
FIG. 5 is a block diagram of the RF circuit of FIG. 1 coupled to a source.

Referring now to FIG. 5, a block diagram of the RF circuit 10 is shown operably associated with a source 74 that transmits an RF signal RFIN. The source 74 is modeled as a Norton equivalent circuit having a Norton equivalent current source, $I_{sNORTON}$, that generates the RF signal RFIN and a Norton equivalent impedance having a resistance, $R_{NORTON}$, and a capacitance, $C_{NORTON}$. The capacitance, $C_{NORTON}$, may be utilized to model the parasitic capacitances of the source 74. In FIG. 5, the RF circuit 10 is being utilized to both provide translational filtering and as a down conversion mixer that down converts the RF signal RFIN to an IF or to baseband frequencies. Thus, the RF circuit 10 may be connected to a low noise amplifier (LNA) in a receiver and the Norton equivalent impedance may model an output impedance of the LNA.

In this case, the poly phase reactive circuit 16 may provide a reactive circuit impedance response similar to the one described in FIG. 3A and thus the input impedance response may be similar to one described in FIG. 3B. The RF circuit 10 may thus behave as an RF bandpass filter having a bandpass tuned to the receive band of interest. The RF circuit 10 receives a mixer input signal MIXIN associated with the RF signal RFIN. Since the RF circuit 10 is also being utilized as an RF mixer the mixer input signal MIXIN may be the RF signal RFIN. The characteristics of the RF circuit 10 are based on an impedance divider created by the impedance of the source 74 and the input impedance response presented by the first mixer circuit 12. The quality factor of the RF circuit 10 is determined by the impedance of the source 74 and losses in the RF circuit 10. As the impedance of the source 74 increases, the quality factor of the RF circuit 10 increases. In FIG. 5, the second in-phase signal IFI2, and the second quadrature phase signal IFQ2 may be utilized as down converted signals and processed by a downstream Digital Signal Processor (DSP).

Figure 6:
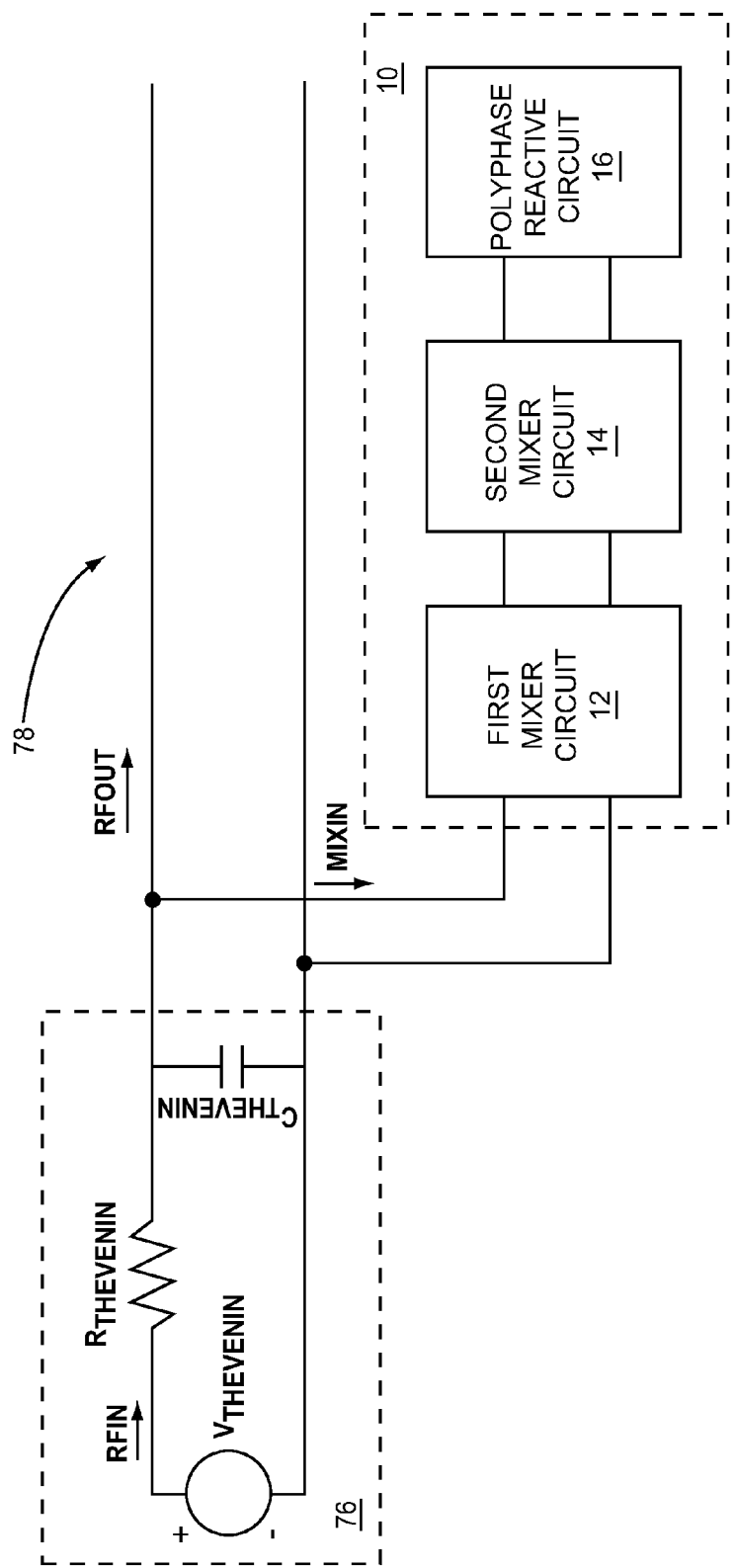
FIG. 6 is another block diagram of the RF circuit of FIG. 1 coupled to a transmission line.

Referring now to FIG. 6, a block diagram of the RF circuit 10 is shown operably associated with another source 76 that transmits the RF signal RFIN. In this case, the RF circuit 10 is coupled in shunt with an RF transmission line 78 to provide translation filtering an produce a filtered RF output signal RFOUT. The filtered RF output signal RFOUT may be transmitted to other downstream circuitry connected to the RF transmission line 78 for further processing. The source 76 may thus be an upstream portion of the RF transmission line 78 upstream. In this case, the source 76 may be modeled as a Thevenin equivalent voltage source that generates the RF signal RFIN and a Thevenin equivalent impedance having a resistance, $R_{THEVENIN}$, and a capacitance, $C_{THEVENIN}$. The poly phase reactive circuit 16 in FIG. 6 may provide a reactive circuit impedance response similar to the one described in FIG. 4A and thus the input impedance response may be similar to one described in FIG. 4B. Since the RF circuit 10 is coupled in shunt with the RF transmission line 78, a notch provided by the RF circuit 10 actually provides a bandpass with respect to the RF transmission line 78. The notch may be tuned to the RF frequency of interest. The mixer input signal MIXIN is associated with the RF signal RFIN since the mixer input signal MIXIN include portions of the RF signal RFIN admitted by the RF circuit 10 based on their frequency.

Figure 7:
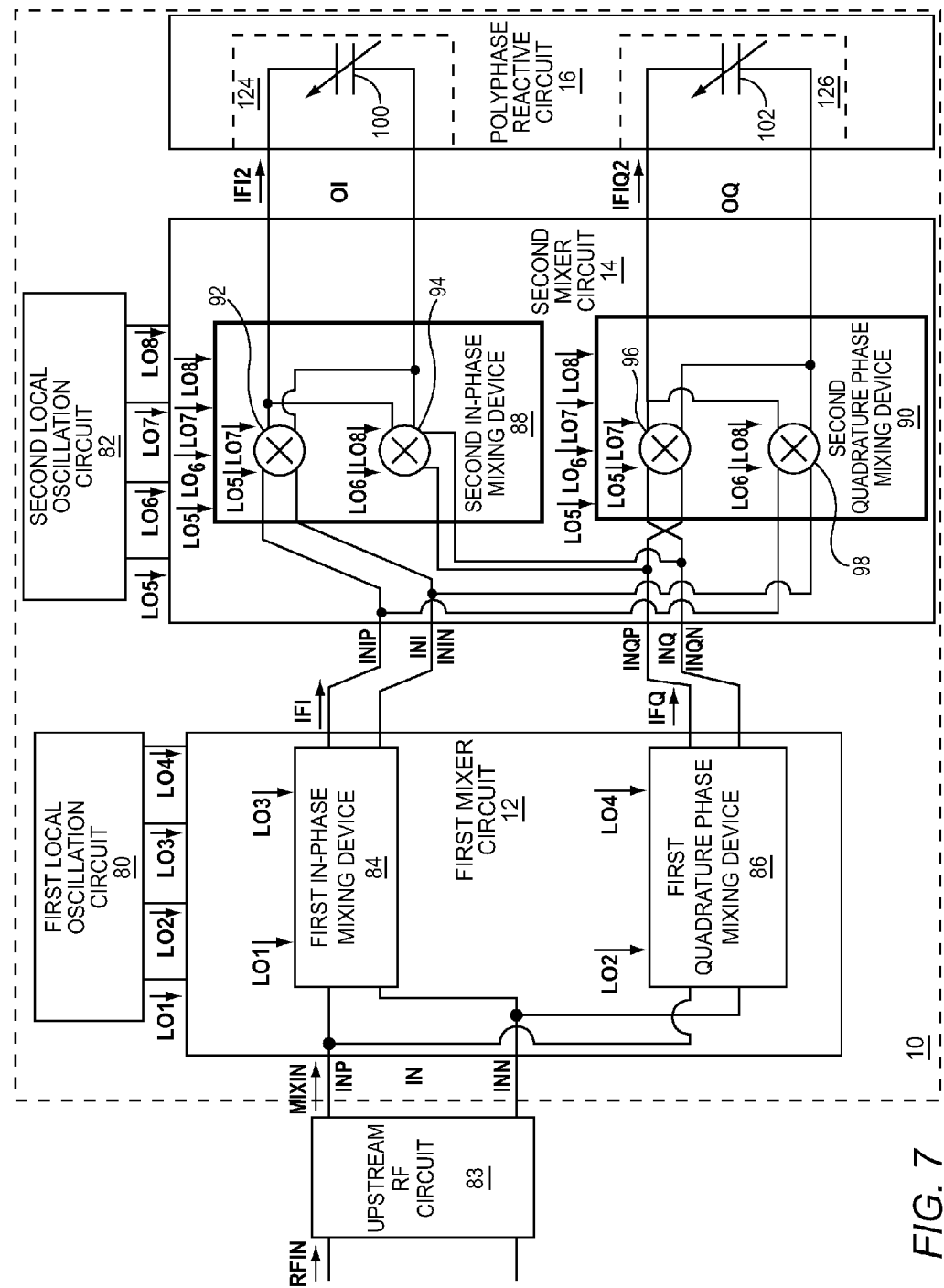
FIG. 7 is a more detailed block diagram of the RF circuit of FIG. 1 coupled to an upstream RF circuit and including a first oscillation circuit and a second oscillation circuit.

FIG. 7 illustrates a more detailed block diagram of the RF circuit 10, which in FIG. 7 also includes a first local oscillation circuit 80 and a second local oscillation circuit 82. The RF circuit 10 is coupled to an upstream RF circuit 83 that transmits the RF signal, RFIN and provides the mixer input signal MIXIN based on the load impedance of the RF circuit 10, which is the input impedance response at the input IN of the first mixer circuit 12. The first local oscillation circuit 80 is operable to generate the first, second, third, and fourth local oscillation signals LO1, LO2, LO3, LO4 all operating at approximately the first oscillation frequency. The input IN of the first mixer circuit 12 includes a positive terminal INP and a negative terminal INN for receiving the mixer input signal MIXIN. Thus, the positive terminal INP provides a positive polarity of the mixer input signal MIXIN and the negative terminal INN provides a negative polarity of the mixer input signal MIXIN. The first mixer circuit 12 is depicted having a first in-phase mixing device 84 and a first quadrature phase mixing device 86. The first in-phase mixing device 84 receives both the positive polarity and the negative polarity of the mixer input signal MIXIN and mixes these signals with the first and third oscillation signals LO1, LO3 to generate the first in-phase signal, IFI. The first quadrature phase mixing device 86 also receives both the positive polarity and the negative polarity of the mixer input signal MIXIN. The first quadrature phase mixing device 86 mixes these signals with the second and fourth oscillation signals LO2 and LO4 to generate the first quadrature phase signal, IFQ.

Note that four oscillations signals LO1, LO2, LO3, LO4 are utilized in FIG. 7 by the first mixer circuit 12. As explained in further detail below, this configuration is provided to transfer the maximum amount of power to the poly phase reactive circuit 16. However, other configurations are within the scope of this disclosure. Alternatively, the first in-phase signal IFI and the first quadrature phase signal IFQ may be generated utilizing just two oscillation signals that are substantially orthogonal to one another. Furthermore, in another alternative, the RF circuit 10 may not be configured to reject a negative frequency impedance response of the reactive circuit impedance response. In this case, only a single oscillation signal operating at approximately the first oscillation frequency may be utilized by the first mixer circuit 12 if desired.

The second mixer circuit 14 receives the first in-phase signal IFI, at input INI and the first quadrature phase signal IFQ, at the input INQ. Input INI, includes a positive terminal INIP and a negative terminal ININ. The positive terminal INIP provides a positive polarity of the first in-phase signal IFI and the negative terminal ININ provides a negative polarity of the first in-phase signal IFI. Input INQ, includes a positive terminal INQP and a negative terminal INQN. The positive terminal INQP provides a positive polarity of the first quadrature phase signal IFQ and the negative terminal INQN provides a negative polarity of the first quadrature signal IFQ.

The second local oscillation circuit 82 is operable to generate the fifth, sixth, seventh, and eighth oscillation signals LO5, LO6, LO7, LO8, which are transmitted to the second mixer circuit 14. The second mixer circuit 14 includes a second in-phase mixing device 88 and a second quadrature phase mixing device 90. The second in-phase mixing device 88 includes a mixing device 92 and a mixing device 94. The second quadrature phase mixing device 90 also includes a mixing device 96 and a mixing device 98. The mixing device 92 receives the positive polarity and the negative polarity of the first in-phase signal IFI and mixes these signals with the fifth oscillation signal LO5 and the seventh oscillation signal LO7. The mixing device 94 receives the positive polarity and the negative polarity of the first quadrature phase signal IFQ and mixes these signals with sixth oscillation signal LO6 and the eighth oscillation signal LO8. The signals output from the mixing device 92 and the mixing device 94 are combined to generate the second in-phase signal IFQ2.

Next, the mixing device 96 receives the positive polarity and the negative polarity of the first in-phase signal IFI and mixes these signals with the sixth oscillation signal LO6 and the eight oscillation signal LO8. The mixing device 98 receives an inverse of the first quadrature phase signal IFQ. A positive polarity and a negative polarity of the inverse of the first quadrature phase signal IFQ. The mixing device 98 mixes these signals with fifth oscillation signal LO5 and the seventh oscillation signal LO7. The signals output from the mixing device 96 and the mixing device 98 of the second quadrature phase mixing device 90 are combined to generate the second quadrature phase signal IFQ2.

Note that four oscillations signals LO5, LO6, LO7, LO8 are utilized in FIG. 7 by the second mixer circuit 14. As explained in further detail below, this configuration is provided to transfer the maximum amount of power to the poly phase reactive circuit 16. However, other configurations are within the scope of this disclosure. Alternatively, the second in-phase signal IFQ2 and the first quadrature phase signal IFQ2 may be generated utilizing just two oscillation signals that are substantially orthogonal to one another. Furthermore, in another alternative, the RF circuit 10 may not include the first mixer circuit 12 but rather may receive the first in-phase signal IFI from a circuit extraneous to the receiver. In another alternative, the RF circuit 10 may not be configured to reject the negative frequency impedance response of the reactive circuit impedance response and/or to simply generate an IF output signal rather than the second in-phase signal IFQ2 and second quadrature phase signal IFQ2. Thus, only a single oscillation signal operating at approximately the second oscillation frequency may be utilized if desired.

Next, in FIG. 7, the poly phase reactive circuit 16 includes a first poly phase reactive device 100 and a second poly phase reactive device 102. The first poly phase reactive device 100 is coupled to receive the second in-phase signal IFQ2 and the second poly phase reactive device 102 is coupled to receive the second quadrature phase signal IFQ2. Other reactive circuit components may be coupled to the first poly phase reactive device 100 and the second poly phase reactive device 102 to provide the desired reactive circuit impedance response. In this case, the first poly phase reactive device 100 and the second poly phase reactive device 102 are each capacitive elements, such as programmable capacitor arrays. Capacitive elements provide an integrative effect which accumulates charge over time. The magnitude of the reactive circuit impedance response may be related to the voltage across the first poly phase reactive device 100 and the voltage across the second poly phase reactive device 102.

Referring now to FIG. 7 and FIGS. 8A-8D, FIG. 8A illustrates embodiments of the first, second, third, and fourth local oscillation signals LO1, LO2, LO3, LO4 generated by the first local oscillation circuit 80 and provided to the first mixer circuit 12. The first, second, third, and fourth local oscillation signals LO1, LO2, LO3, LO4 are each generated by the first local oscillation circuit 80 at approximately the first oscillation frequency. Also, first, second, third, and fourth local oscillation signals LO1, LO2, LO3, LO4 each include a first, second, third, and fourth periodic activation state, 104, 106, 108, 110, respectively. The first in-phase mixing device 84 and the first quadrature phase mixing device 86 may each include a plurality of switches that are each activated by one or more of the periodic activation states to generate the first in-phase signal IFI and the first quadrature phase signal IFQ. Ideally, the upstream RF circuit 83 is purely resistive and the phase of the RF signal RFIN, shown in FIG. 8A, matches the phase of the mixer input signal MIXIN when the RF signal RFIN and MIXIN are operating approximately at the first oscillation frequency. Thus, in the ideal case, additional adjustments by the second mixer circuit 14 to further offset the input impedance response would not be required. However, parasitic reactive impedances in the upstream RF circuit 83 may be high enough that further adjustments are required by the second mixer circuit 14.

FIG. 8B illustrates the mixer input signal MIXIN when the phase and frequency of the mixer input signal MIXIN matches the phase and frequency of the first, second, third, and fourth local oscillation signals LO1, LO2, LO3, LO4. The signal 112 depicts the mixer input signal MIXIN, if the second mixer circuit 14 where not provided. The signal 112 may have a phase difference 114 with the first, second, third, and fourth local oscillation signals LO1, LO2, LO3, LO4, which effects the amount of power provided to the poly phase reactive circuit 16. Although the frequency offset provided by the first mixer circuit 12 for the input impedance response is based on the first oscillation frequency, the voltage at the first poly phase reactive device 100, shown as $V_{C1}$, and the second poly phase reactive device 102, shown as $V_{C2}$ may be effected by the phase difference 114, which causes an unacceptable discrepancy between the frequency offset provided by the first mixer circuit 12 and the first oscillation frequency.

Note that the first periodic activation state 104, the second periodic activation state 106, the third periodic activation state 108, and the fourth periodic activation state 110 do not overlap and are provided approximately at the same first oscillation frequency. In one embodiment, the first oscillation frequency may be approximately 1 GHz. The first, second, third, and fourth local oscillation signals LO1, LO2, LO3, LO4 each have different phases. A phase difference between the first local oscillation signal LO1 and the second oscillation signal LO2 is such that the first local oscillation signal LO1 is substantially orthogonal with one another the second oscillation signal LO2. Thus, a difference in phase between the first local oscillation signal LO1 and the second local oscillation signal LO2 is around 90° or $$\frac{\pi}{2}$$

radians. Practical considerations, such as the non-ideal behavior and the accuracy of the first local oscillation circuit 80 may cause the first, second, third, and fourth local oscillation signals LO1, LO2, LO3, LO4 to not each operate at precisely the first oscillation frequency. Also, practical considerations may cause the first local oscillation signal LO1 and the second local oscillation signal LO2 to not be exactly orthogonal. In FIG. 8A, the first local oscillation signal LO1 leads the second oscillation signal LO2 by around 90° or $$\frac{\pi}{2}$$

radians. However, the first local oscillation signal LO1 and second local oscillation signal LO2 may also be substantially orthogonal if the first local oscillation signal LO1 lags the second local oscillation signal LO2 by around 90° or $$\frac{\pi}{2}$$

radians.

The third local oscillation signal LO3 has a difference in phase of around 180° or π radians such that the third local oscillation signal is in antiphase with the first local oscillation signal LO1. The fourth local oscillation signal LO4 has a phase difference of around 180° or π radians with the second local oscillation signal LO2 such that the fourth oscillation signal is substantially in antiphase with the second local oscillation signal LO2. Consequently, the third oscillation signal LO3 and the fourth oscillation signal LO4 are substantially orthogonal to one another. The four oscillation signals, LO1, LO2, LO3, LO4 allow the first mixer circuit 12 to provide the first in-phase signal IFI and the first quadrature phase signal IFQ so that the maximum amount of power is transferred to the poly phase reactive circuit 16.

The first in-phase mixing device 84 mixes the positive polarity of the mixer input signal MIXIN with the first local oscillation signal LO1, the negative polarity of the mixer input signal MIXIN with the third local oscillation signal LO3, to generate the first in-phase signal IFI, as shown in FIG. 8C. The first quadrature phase mixing device 86 mixes the positive polarity of the mixer input signal MIXIN with the second local oscillation signal LO2 and a negative polarity of the mixer input signal MIXIN with the fourth local oscillation signal LO4 to generate the first quadrature phase signal, IFQ, as shown in FIG. 8D. The first in-phase signal IFI and the first quadrature phase signal IFQ are based on the mixer input signal MIXIN and are substantially orthogonal to one another.

The first in-phase signal IFI and the first quadrature phase signal IFQ have been down coverted by the first mixer circuit 12 to an IF or baseband frequency. By utilizing the four oscillation signals LO1, LO2, LO3, LO4, the first in-phase signal IFI and the first quadrature phase signal IFQ are provided in a form that permits the second mixer circuit 14 to have a rectifying effect and maximize the power transfer to the poly phase reactive circuit 16.

The second mixer circuit 14 may receive the first in-phase signal IFI and the first quadrature phase signal IFQ so that the mixer input signal MIXIN is in phase with the four oscillation signals, LO1, LO2, LO3, LO4 at the first oscillation frequency. In effect, the second mixer circuit 14 shifts the input impedance response of the first mixer circuit 12 to the appropriate frequency offset. To do this, the second mixer circuit 14 may be configured so that the input impedance response of the first mixer circuit 12 matches the source impedance at the first oscillation frequency, which places the mixer input signal MIXIN at the appropriate phase and frequency to compensate for the phase difference 114.

Referring now to FIG. 7 and FIGS. 9A-9C, FIG. 9A illustrates one embodiment of the fifth, sixth, seventh, and eighth local oscillation signals LO5, LO6, LO7, LO8, which are provided by the second local oscillation circuit 82 at approximately the second oscillation frequency. Again, practical considerations, such as non-ideal circuit behavior and the accuracy of the second local oscillation circuit 82, may prevent the fifth, sixth, seventh, and eighth local oscillation signals LO5, LO6, LO7, LO8, from being precisely at the second oscillation frequency. Generally, the second oscillation frequency is lower than the first oscillation frequency. In one embodiment, the second local oscillation circuit 82 can be varied by the second local oscillation frequency from 0-100 kHz.

Each of the fifth, sixth, seventh, and eighth local oscillation signals LO5, LO6, LO7, LO8, have a fifth, sixth, seventh, and eighth periodic activation state, 116, 118, 120, 122, respectively. Note that the fifth periodic activation state 116, the sixth periodic activation state 118, the seventh periodic activation state 120, and the eighth periodic activation state 122 do not overlap but are provided approximately at the same first oscillation frequency. Also, practical considerations, such as the non-ideal behavior and accuracy of the first local oscillation circuit 80 may cause the fifth, sixth, seventh, and eight local oscillation signals LO5, LO6, LO7, LO8 to not each operate at precisely the second oscillation frequency.

The fifth, sixth, seventh, and eight local oscillation signals LO5, LO6, LO7, LO8 each have different phases. A difference in phase between the fifth local oscillation signal LO5 and the sixth oscillation signal LO6 is such that the fifth local oscillation signal LO5 is substantially orthogonal the sixth oscillation signal LO6. Thus, the difference in phase between the fifth local oscillation signal LO5 and the sixth local oscillation signal LO6 is around 90° or $$\frac{\pi}{2}$$

radians. Again, practical considerations, such as non-ideal circuit behavior and the accuracy of the second local oscillation circuit 82, may cause the fifth local oscillation signal LO5 and the sixth local oscillation signal LO6 to not be exactly oscillation signal LO6 by around 90° or $$\frac{\pi}{2}$$

radians. However, the fifth local oscillation signal LO5 and the sixth local oscillation signal LO6 may also be substantially orthogonal if the fifth local oscillation signal LO5 lags the sixth local oscillation signal LO6 by around 90° or $$\frac{\pi}{2}$$

radians.

The seventh local oscillation signal LO7 has a difference in phase of around 180° or π radians so that the seventh local oscillation signal LO7 is substantially in antiphase with the fifth local oscillation signal LO5. The eight local oscillation signal LO8 has a phase difference of around 180° or π radians with the sixth local oscillation signal LO6 such that the eight local oscillation signal LO8 is substantially in antiphase with the sixth local oscillation signal LO6. Consequently, the seventh oscillation signal LO7 and the eighth oscillation signal LO8 are substantially orthogonal to one another.

The mixing device 92 of the second in-phase mixing device 88 mixes the positive polarity of the first in-phase signal IFI with the fifth local oscillation signal LO5 and the negative polarity of the first in-phase signal IFI with the seventh oscillation signal LO7. The mixing device 94 of the second in-phase mixing device 88 mixes the positive polarity of the first quadrature phase signal IFQ with the sixth local oscillation signal LO6 and the negative polarity of the first quadrature phase signal IFQ with the eight local oscillation signal, LO8. The outputs of each of the mixing device 92 and the mixing device 94 are combined at the output OI to generate the second in-phase signal IFI2, shown in FIG. 9B.

Figure 9A:
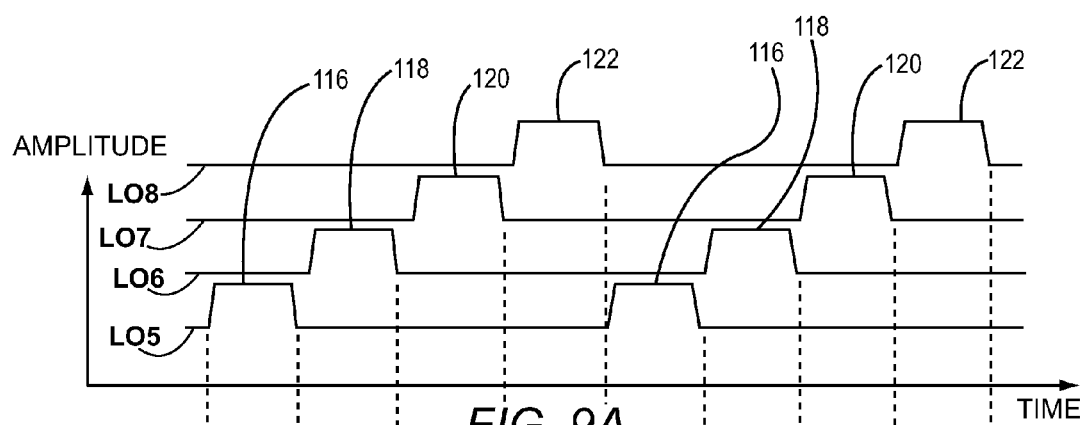
FIG. 9A illustrates an embodiment of four other oscillations signal.
Figure 9B:
FIG. 9B is a graph of one embodiment of a second in-phase signal.
Figure 9C:
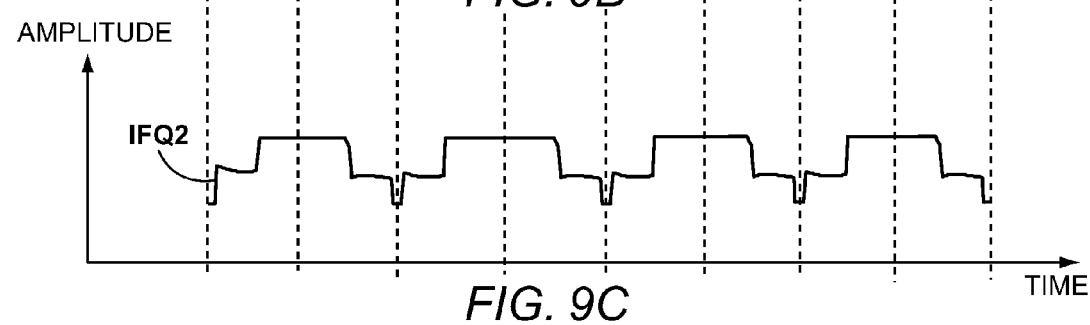
FIG. 9C is a graph of one embodiment of a second quadrature phase signal.

The mixing device 96 of the second quadrature phase mixing device 90 mixes a positive polarity of an inverse of the first quadrature phase signal IFQ with the fifth local oscillation signal LO5 and a negative polarity the inverse of the first quadrature phase signal IFQ with the seventh oscillation signal LO7. The mixing device 98 of the second quadrature phase mixing device 90 mixes the positive polarity of the first in-phase signal IFI with the sixth oscillation signal LO6 and the negative polarity of the first in-phase signal IFI with the eighth local oscillation signal LO8. The outputs of each of the mixing device 96 and the mixing device 98 are combined at the output OQ to generate the second quadrature signal IFQ2 from the second in-phase mixing device, which is shown in FIG. 9C. As shown by FIGS. 9B and 9C, the second in-phase signal IFI2 is substantially orthogonal to the second quadrature phase signal IFQ2. The second mixer circuit 14 provides another frequency offset for the input impedance response at the input IN of the first mixer circuit 12. By varying the second oscillation frequency, the fifth, sixth, seventh, and eight oscillation signals LO5, LO6, LO7, LO8 provide the appropriate phase and frequency shift to change the phase and frequency of the first mixer input signal MIXIN and compensates for the phase difference 114. Also, the second mixer device 14 has a rectifying effect to maximize the power transferred to the poly phase reactive circuit 16.

The second in-phase signal IFI2 and the second quadrature phase signal IFQ2 are provided to the poly phase reactive circuit 16. The first poly phase reactive device 100 may be provided in an in-phase channel 124 of the poly phase reactive circuit 16. The magnitude of the voltage across the first poly phase reactive device 100 is related to the magnitude of the impedance response of the of the in-phase channel 124. Similarly, the second poly phase reactive device is provided in a quadrature phase channel 126 of the poly phase reactive circuit 16. The magnitude of the voltage across the poly phase reactive circuit 16 is related to the impedance response of the quadrature phase channel 126.

Based on the fifth, sixth, seventh, and eight local oscillation signals LO5, LO6, LO7, LO8 and the polarities of the first in-phase signal IFI and first quadrature phase signal IFQ mixed by the second in-phase mixing device 88, the integrative operation of the first poly phase reactive device 100 on the fundamental frequency, f, of the second in-phase signal IFI2 can be approximated to be:

$$\int_0^{\frac{\pi}{2}} \cos(2\pi ft)dt + \int_{\frac{\pi}{2}}^{\pi} \sin(2\pi ft)dt -$$

$$\int_{\pi}^{\frac{3\pi}{2}} \cos(2\pi ft)dt - \int_{\frac{3\pi}{2}}^{2\pi} \sin(2\pi ft)dt = 4$$

Note that the following equation assumes a normalized amplitude of 1. Also, the equation assumes that the fifth local oscillation signal LO5 leads the sixth oscillation signal LO6 by approximately $$\frac{\pi}{2}$$

radians. The second in-phase mixing device 88 has a rectifying effect thereby providing the maximum power transfer to the first poly phase reactive device 100. As shown by the equation above, the fundamental tone is integrated. As for the 3rd harmonic of the second in-phase signal IFI2, the integrative operation of the first poly phase reactive device can be approximated to be:

$$\int_0^{\frac{\pi}{2}} \cos(6\pi ft)dt + \int_{\frac{\pi}{2}}^{\pi} \sin(6\pi ft)dt -$$

$$\int_{\pi}^{\frac{3\pi}{2}} \cos(6\pi ft)dt - \int_{\frac{3\pi}{2}}^{2\pi} \sin(6\pi ft)dt = 0$$

Consequently, the third harmonic may be rejected.

Next, based on the fifth, sixth, seventh, and eight local oscillation signals LO5, LO6, LO7, LO8 and the polarities of the first in-phase signal IFI and the inverse of the first quadrature phase signal IFQ mixed by the second quadrature phase mixing device 90, the integrative operation of the second poly phase reactive device 102 on the fundamental frequency, f, of the second quadrature phase signal IFQ2 can be approximated to be:

$$\int_0^{\frac{\pi}{2}} -\sin(2\pi ft)dt + \int_{\frac{\pi}{2}}^{\pi} \cos(2\pi ft)dt -$$

$$\int_{\pi}^{\frac{3\pi}{2}} -\sin(2\pi ft)dt - \int_{\frac{3\pi}{2}}^{2\pi} \cos(2\pi ft)dt = -4$$

The second quadrature phase mixing device 90 has a rectifying effect thereby providing maximum power transfer to the second poly phase reactive device 102. As for the 3rd harmonic of the second quadrature phase signal IFQ2, the integrative operation of the second poly phase reactive device 102 can be approximated to be:

$$\int_0^{\frac{\pi}{2}} -\sin(6\pi ft)dt + \int_{\frac{\pi}{2}}^{\pi} \cos(6\pi ft)dt -$$

$$\int_{\pi}^{\frac{3\pi}{2}} -\sin(6\pi ft)dt - \int_{\frac{3\pi}{2}}^{2\pi} \cos(6\pi ft)dt = 0$$

Consequently, the third harmonic is also rejected. Note from the equations above for the fundamental tone that the integrative operation of the first poly phase reactive device 100 and the second poly phase reactive device 102 reject the negative frequency impedance response of the second in-phase signal IFI2 and second quadrature phase signal IFQ2. This can be seen from the equations above if 180° or π radians is added to one of either the in-phase channel 124 or quadrature phase channel 126. Thus, the input impedance response of the first mixer circuit 12 at the input IN rejects the negative frequency impedance response of the poly phase reactive circuit 16.

A combination of the impedance response of first poly phase reactive device 100, the second poly phase reactive device 102, along with other reactive components may provide the reactive circuit impedance response of the poly phase reactive circuit 16 and thus the input impedance response at the input IN of the first mixer circuit 12. Based on the equations above, the combination of both the in-phase channel 124 and quadrature phase channel 126 for the poly phase reactive circuit 16 shown in FIG. 7 may go to zero when the fifth local oscillation signal LO5 leads the sixth oscillation signal LO6 by approximately $$\frac{\pi}{2}$$

radians. On the other hand, if the fifth local oscillation signal LO5 lagged the sixth oscillation signal LO6 by approximately $$\frac{\pi}{2}$$

radians, a beat frequency based on the fundamental tone, f, would be seen at the poly phase reactive circuit 16.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) circuit comprising:
a first mixer circuit configured to receive a first oscillation signal operating at approximately a first oscillation frequency and an input signal, wherein the first mixer circuit is configured to generate a first in-phase signal from the input signal with a frequency offset based on the first oscillation frequency and to generate a first quadrature phase signal from the input signal with a frequency offset based on the first oscillation frequency;
a second mixer circuit operably associated with first mixer circuit and configured to receive a second oscillation signal operating at approximately a second oscillation frequency, wherein the second mixer circuit is configured to generate a second in-phase signal from the first in-phase signal and the first quadrature phase signal, such that the second in-phase signal has a frequency offset based on the second oscillation frequency, and to generate a second quadrature phase signal from the first in-phase signal and the first quadrature phase signal such that the second quadrature phase signal has a frequency offset based on the second oscillation frequency; and
a polyphase reactive circuit comprising an in-phase channel having an in-phase impedance response, wherein the in-phase channel is configured to integrate the second in-phase signal from the second mixer circuit, and a quadrature phase channel having a quadrature phase impedance response, wherein the quadrature phase channel is configured to integrate the second quadrature phase signal from the second mixer circuit.

2. The RF circuit of claim 1 wherein the in-phase channel comprises a capacitive element that is configured to integrate the second in-phase signal.

3. The RF circuit of claim 1 wherein the quadrature phase channel comprises a capacitive element that is configured to integrate the second quadrature phase signal.

4. The RF circuit of claim 1 wherein:
the in-phase channel comprises a first capacitive element that is configured to integrate the second in-phase signal; and
the quadrature phase channel comprises a second capacitive element that is configured to integrate the second quadrature phase signal.

5. The RF circuit of claim 4 wherein the first capacitive element comprises a first programmable capacitor array and the second capacitive element comprises a second programmable capacitor array.

6. A radio frequency (RF) circuit comprising:
a first mixer circuit configured to receive an input signal, a first oscillation signal operating approximately at a first oscillation frequency, a second oscillation signal operating approximately at the first oscillation frequency and being substantially orthogonal to the first oscillation signal, a third oscillation signal operating approximately at the first oscillation frequency and being substantially in antiphase with the first oscillation signal, and a fourth oscillation signal operating approximately at the first oscillation frequency and being substantially in antiphase with the second oscillation signal, wherein the first mixer circuit comprises:
a first in-phase mixing device configured to mix the input signal with the first oscillation signal and with the third oscillation signal so as to generate a first in-phase signal from the input signal; and
a first quadrature mixing device configured to mix the input signal with the second oscillation signal and the fourth oscillation signal so as to generate a first quadrature phase signal from the input signal; and
a second mixer circuit configured to receive the first in-phase signal, the first quadrature phase signal, a fifth oscillation signal operating approximately at a second oscillation frequency, a sixth oscillation signal operating approximately at the second oscillation frequency and being substantially orthogonal to the fifth oscillation signal, a seventh oscillation signal operating approximately at the second oscillation frequency and being substantially in antiphase with the fifth oscillation signal, and an eighth oscillation signal operating approximately at the second oscillation frequency and being substantially in antiphase with the sixth oscillation signal, wherein the second mixer circuit comprises:
a second in-phase mixing device configured to mix the first in-phase signal with the fifth oscillation signal, the first quadrature phase signal with the sixth oscillation signal, a negative polarity of the first in-phase signal with the seventh oscillation signal, and a negative polarity of the first quadrature phase signal with the eighth oscillation signal to generate a second in-phase signal; and
a second quadrature phase mixing device configured to mix an inverse of the first quadrature phase signal with the fifth oscillation signal, the first in-phase signal with the sixth oscillation signal, a negative polarity of the inverse of the first quadrature phase signal with the seventh oscillation signal, and the negative polarity of the first in-phase signal with the eighth oscillation signal to generate a second quadrature phase signal.

7. The RF circuit of claim 6, further comprising a poly phase reactive circuit having a first reactive device configured to integrate the second in-phase signal and a second reactive device configured to integrate the second quadrature phase signal.

8. The RF circuit of claim 7 wherein the first reactive device comprises a capacitive element that is configured to integrate the second in-phase signal.

9. The RF circuit of claim 7 wherein the second reactive device comprises a capacitive element that is configured to integrate the second quadrature phase signal.

10. The RF circuit of claim 7 wherein:
the first reactive device comprises a first capacitive element that is configured to integrate the second in-phase signal; and
the second reactive device comprises a second capacitive element that is configured to integrate the second quadrature phase signal.

11. The RF circuit of claim 10 wherein the first capacitive element comprises a first programmable capacitor array and the second capacitive element comprises a second programmable capacitor array.

* * * * *